US006640320B1

(12) United States Patent
Holaday

(10) Patent No.: US 6,640,320 B1
(45) Date of Patent: Oct. 28, 2003

(54) HARDWARE CIRCUITRY TO SPEED TESTING OF THE CONTENTS OF A MEMORY

(75) Inventor: David A. Holaday, Cornelius, OR (US)

(73) Assignee: Tektronix, Inc., Beaverton, OR (US)

( * ) Notice: Subject to any disclaimer, the term of this patent is extended or adjusted under 35 U.S.C. 154(b) by 359 days.

(21) Appl. No.: 09/651,533

(22) Filed: Aug. 29, 2000

(51) Int. Cl.$^7$ ............................................... G11C 29/00
(52) U.S. Cl. ...................................................... 714/719
(58) Field of Search ................... 714/735–736, 714/719; 365/201

(56) References Cited

U.S. PATENT DOCUMENTS 5,894,484 A * 4/1999 Illes et al. .................. 714/738
6,256,760 B1 * 7/2001 Carron et al. ............... 714/726

* cited by examiner

*Primary Examiner*—Emmanuel L. Moise
*Assistant Examiner*—Shelly A Chase
(74) *Attorney, Agent, or Firm*—David N. Caracappa; William K. Bucher

(57) ABSTRACT

An electronic system includes a source of test data, which, if the test data source is operating properly, is a pattern of a limited number of data words successively repeated. A memory device is coupled to the test data source and stores the test data. A memory test circuit compares the stored test data to successively repeated pattern data words and generates a signal to indicate whether the stored test data is the same as the successively repeated pattern data words.

8 Claims, 4 Drawing Sheets

HARDWARE CIRCUITRY TO SPEED TESTING OF THE CONTENTS OF A MEMORY

FIELD OF THE INVENTION

The present invention relates to circuitry for testing the contents of large capacity memory devices and the operation of electronic equipment including such devices.

BACKGROUND OF THE INVENTION

As memory devices get larger in capacity, and cheaper in price, electronic equipment is designed to make use of larger quantities of memory. For example, electronic equipment such as digital oscilloscopes and logic analyzers use memories to store test data received from units-under-test. Recently, for example, logic analyzers have been designed to include on the order of 300 to 400 megabytes, or more, of high speed (e.g. 12 nanosecond (ns)) memory. These instruments must be manufactured, tested and calibrated before being sold, all of which involve testing the memory. In addition, before each use, the instruments must be tested to ensure they are in operational order, including testing of the memory. Some of these tests test the proper operation of the memory by itself, and others use the memory to test the proper operation of other portions of the instrument.

In the former tests, data is written directly into the memory device, then the contents of the memory device are retrieved and checked to ensure that they are as desired. In the latter tests, other circuitry in the instrument is used to write data into the memory, then the contents of the memory are retrieved and checked to determine if the memory contains the expected values. For example, in a logic analyzer or oscilloscope, a probe may be connected to a source of a signal, such as an external pattern generator, which, if processed properly, would cause data having a known pattern of values to be stored in successive locations in the memory. After such a signal has been acquired, processed and stored, the memory is checked to determine of it has the expected data value pattern. Alternatively, a pattern generator may be included in the processing circuitry chain to generate data which should result in a predetermined pattern of data in the memory.

One prior art solution used a microprocessor to test the memories, or determine whether the content of the memory was as desired. The microprocessor wrote data into, and/or retrieved data from, the memory being tested and checked the retrieved data against expected values. The memory itself is very high speed (e.g. 12 ns, as described above) and capable of being completely filled and read-back in a reasonable amount of time. However, even the fastest microprocessor is much slower than that, and would take a relatively long time to test a memory as large as 20 megabytes. When such processors are used to test such large memories, the testing can require testing times on the order of hours. This is too long for manufacturing and calibration, and far too long for self-testing when a user first powers up the equipment.

Another prior art solution speeds up memory testing, compared to using a microprocessor, by using dedicated memory testing hardware. Such a solution is disclosed in U.S. Pat. No. 4,414,665, issued Nov. 8, 1983 to Kimura et al. In Kimura et al., hardware is used to test the proper operation of a memory. IC chip for pass/fail purposes in a manufacturing setting. Referring to FIG. 1 of Kimura et al., a pattern generator 11 is used to supply both an address (terminal 12) and data (terminal 13) to a memory unit under test 15. The data (13) from the pattern generator 11 is written into the location of the memory 15 specified by the address (12). Data is then read from the location in the memory 15 specified by the address (12), and that data supplied to a comparison circuit 19. The pattern generator 11 also supplies the result (terminal 14) expected from the memory 15 in response to the address (12) and data (13). The expected result (14) is also supplied to the comparison circuit 19. If the data retrieved from the memory 15 matches the expected result (14), then the pattern generator 11 increments to the next address and the process repeats until the whole memory has been tested. If the data retrieved from the memory 15 does not match the expected result (14) a disagreement signal is generated for that memory 15 address and stored in a fault-address memory 17. The contents of this fault address memory 17 are retrieved by a control section 23 and analyzed to determine the operational status of the memory 15 being tested.

The hardware solution of Kimura et al. can read and write data to and from the memory at the full speed of the memory. However, the testing circuitry disclosed is for testing memory IC chips after fabrication to determine whether they operate properly. This solution requires a pattern generator 11 which has the same number of locations as that in the memory to be test, and a substantially wider word size: each location in the pattern generator 11 stores a data word which includes the address (12) and data (13) for the memory 15 and also the expected result (14) from the memory. This solution is also not adapted to testing a memory in situ, i.e. as it is embodied in a piece of electronic equipment. There is also no disclosure or suggestion of the disclosed circuitry using other portions of a piece of electronic equipment to fill the memory, nor is there any suggestion to read and test the memory contents after being filled in that way to test the operation of the other portions of the electronic equipment. In addition, Kimura et al. writes into, and reads from, and tests the contents of a single memory location before moving on to the next location. Put another way, it does not write data to the whole memory then test the contents of the memory. For this reason, also, it cannot be used to test the operation of other circuitry in a piece of electronic equipment.

A memory test circuit which can operate on a memory in situ at the full speed of the memory; which does not require a large pattern generator, which can write a pattern into the complete memory then check the pattern written into the memory; which can receive memory data from other circuitry in the electronic equipment and then check that data to determine if it is as expected, is desirable.

BRIEF SUMMARY OF THE INVENTION

An electronic system includes a source of test data, which, if the test data source is operating properly, is a pattern of a limited number of data words successively repeated. A memory device is coupled to the test data source and stores the test data. A memory test circuit compares the stored test data to successively repeated pattern data words and generates a signal to indicate whether the stored test data is the same as the successively repeated pattern data words.

Such a system does not rely on a microprocessor for testing of the values in the memory device, and consequently can operate at the full speed of the memory device. Using such a system also permits testing of a memory in situ. In addition, use of a pattern consisting of a limited number of data words, which is successively repeated obviates the requirement for a large pattern generator.

DETAILED DESCRIPTION OF THE INVENTION

Figure 1:
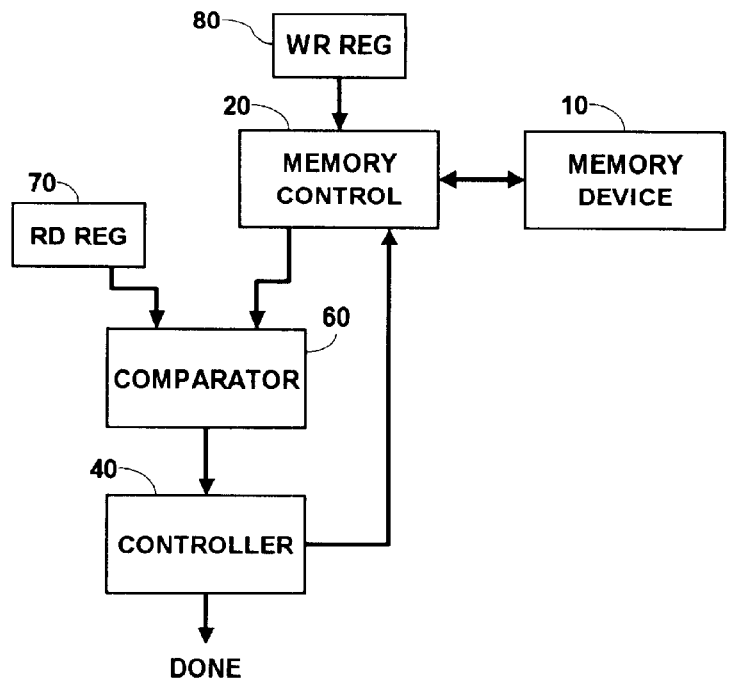
FIG. 1 is a block diagram of one embodiment of a memory test circuit according to the present invention.

FIG. 1 is a block diagram of one embodiment of a memory test circuit according to the present invention. In FIG. 1, a memory device 10 is being tested. A memory control circuit 20 is bidirectionally coupled to the memory device 10. An output terminal of a write data register 80 is coupled to a data input terminal of the memory control circuit 20. A data output terminal of the memory control circuit 20 is coupled to a first input terminal of a comparator 60. An output terminal of a read data register 70 is coupled to a second input terminal of the comparator 60. An output terminal of the comparator 60 is coupled to an input terminal of a controller 40. A control output terminal of the controller 40 is coupled to a control input terminal of the memory control circuit 20. A status output terminal of the controller 40 is coupled to an output terminal DONE. The output terminal DONE is coupled to an input terminal of a microprocessor (not shown). The microprocessor is also coupled to the other circuitry in FIG. 1 (and other circuitry in the instrument) in a known manner to write data into, read data from, control the operation of, and receive the status of those circuits, though this is not illustrated in order to simplify the figure.

Figure 2:
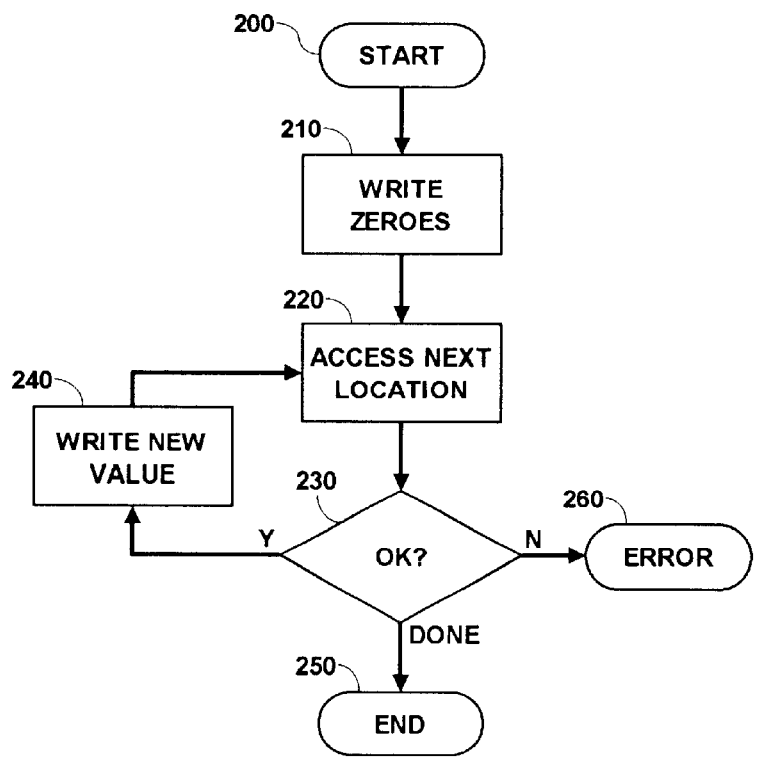
FIG. 2 is a flow diagram of a method of testing a memory performed by the memory test circuit of FIG. 1.

In operation, the circuitry illustrated in FIG. 1 is used to test the memory by itself FIG. 2 is a flow diagram of a method of testing a memory performed by the memory test circuit of FIG. 1. Referring to FIG. 1 and FIG. 2, testing begins in step 200. In step 210 a data value is written into every location in the memory device 10. For example, in the illustrated embodiment, zeroes are written into all the locations in the memory device 10. The microprocessor (not shown) writes the data value, e.g. zero, into the write register 80. The microprocessor then conditions the controller 40 to initiate writing the value in the write register 80 into every location in the memory device 10. The controller 40 conditions the memory controller 20 to write the value in the write register 80 into the first location in the memory device 10, then to increment the location and write the value in the write register 80 into the next location, and so forth, until all locations have been written. The controller asserts the DONE signal when all the locations have been written. Because it is performed by the hardware circuitry illustrated in FIG. 1, this step may be performed at the full speed of the memory device 10.

The locations in the memory device 10 are then sequentially checked to see if they contain the correct value. If they do, a different value is written into that location and checking proceeds. If they do not, this indicates an error and processing halts. The microprocessor (not shown) writes the value which is expected to be in each location in the memory device 10 into the read register 70. Continuing the current example, this value is zero. The microprocessor then writes a new value to be written into the memory device 10 into the write register 80. Continuing the example, a value of all ones (FF) is written into the write register 80. The microprocessor then conditions the controller 40 to perform the following processing.

In step 220, the first memory location is accessed and data from that location is retrieved from the memory device 10. In step 230, that value is compared to the expected value. The memory controller 20 supplies the retrieved data to the comparator 60. The comparator 60 compares this value to the value in the read register 70, and supplies a signal representing the results of that comparison to the controller 40. In step 240, if the value of the data retrieved from the memory device 10 is the same as the value in the read register 70, then the controller 40 conditions the memory controller 20 to write the value in the write register 80 into the memory at the same location. Step 220 is then repeated but for the next location in the memory.

In step 250, if it is determined that all the locations in the memory device 10 have been successfully read from (and written to) in step 230, then the DONE signal is asserted. The microprocessor responds to the DONE signal by writing the value currently in the write register 80 into the read register 70, writing a new value to be written into all the locations in the memory device 10 into the write register 80 and conditioning the controller 40 to repeat the processing described above for the new values. Different values are written into the memory device 10 until testing is complete. For example, values of 00, FF, AA, 55, CC, and 33 may be sequentially written into all the locations in the memory device 10. If all of these values are successfully written into and read from the memory device 10 it is deemed operational. One skilled in the art will understand that other values and/or other sequences may also be used to test the operation of the memory device 10.

In step 260, if at any time during the testing the value of the data retrieved from the memory device 10 in step 220 is not the same as the value in the read register 70, then the controller 40 stops and indicates an error to the microprocessor. This may be indicated by asserting a separate error signal, or by asserting the DONE signal. In this case, in response to the DONE signal, the microprocessor accesses the memory address register in the memory controller 20. If the memory address register has a value one more than the size of the memory device 10, this indicates that data has been successfully read from and written to the memory device 10, and the processing described above with reference to step 250 is performed. Otherwise, the value of the memory address register indicates the address at which the error occurred. The microprocessor can then initiate diagnostic processing to further identify and isolate the error and report it to the user.

Figure 3:
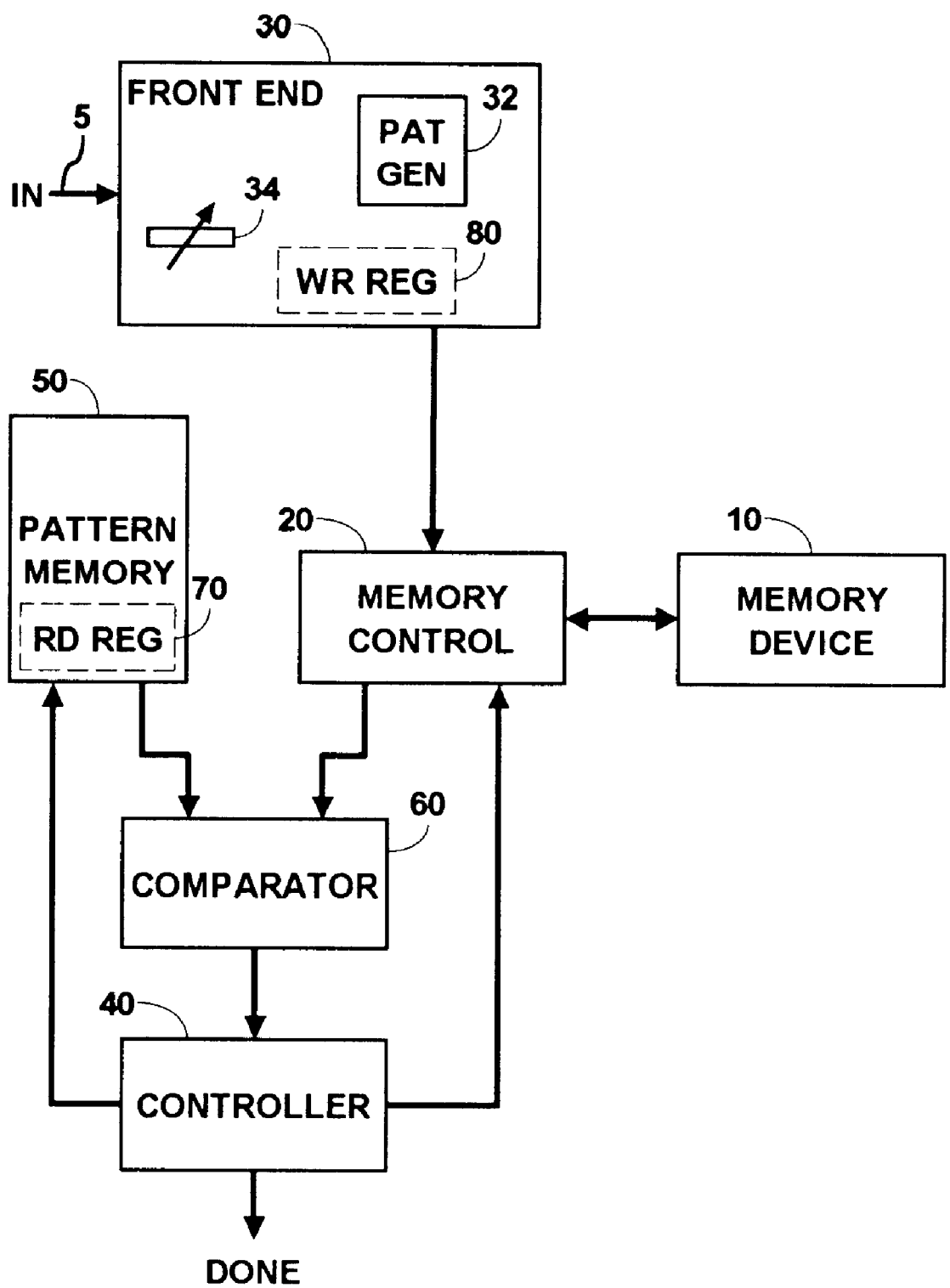
FIG. 3 is a block diagram of another embodiment of a memory test circuitry according to the present invention.

FIG. 3 is a block diagram of another embodiment of a memory test circuit according to the present invention. In FIG. 3, those elements which are the same as those illustrated in FIG. 1 are designated by the same reference number and are not described in detail below. In FIG. 3, an input terminal 5, which in the illustrated embodiment is a signal probe, is coupled to an input terminal of an instrument front end circuit 30. An output terminal of the front end circuit 30 is coupled to the input terminal of the memory control circuit 20. The front end circuit 30 further includes a pattern generator 32 and a variable circuit element 34. An output terminal of a pattern memory 50 is coupled to the second input terminal of the comparator 60. A second control output terminal of the controller 40 is coupled to a control input terminal of the pattern memory 50.

Under normal operation, when the instrument is being used to test a circuit, the instrument front end circuit 30 receives signals from a unit-under-test via the input probe 5, processes these signals, and stores data in the memory device 10 representing these signals, all in a known manner. During operation of the embodiment of the memory test circuit illustrated in FIG. 3, the front end circuit 30 operates to generate what should be a repeating pattern of data to be stored in the memory device 10. The contents of the memory device 10 is then tested by the circuitry illustrated in FIG. 3 to determine if that repeating pattern is present in the memory device. If so, then that portion of the front end circuit 30 which generated that pattern is deemed to be operating properly, otherwise diagnostic procedures may be performed to determine why not.

Figure 4:
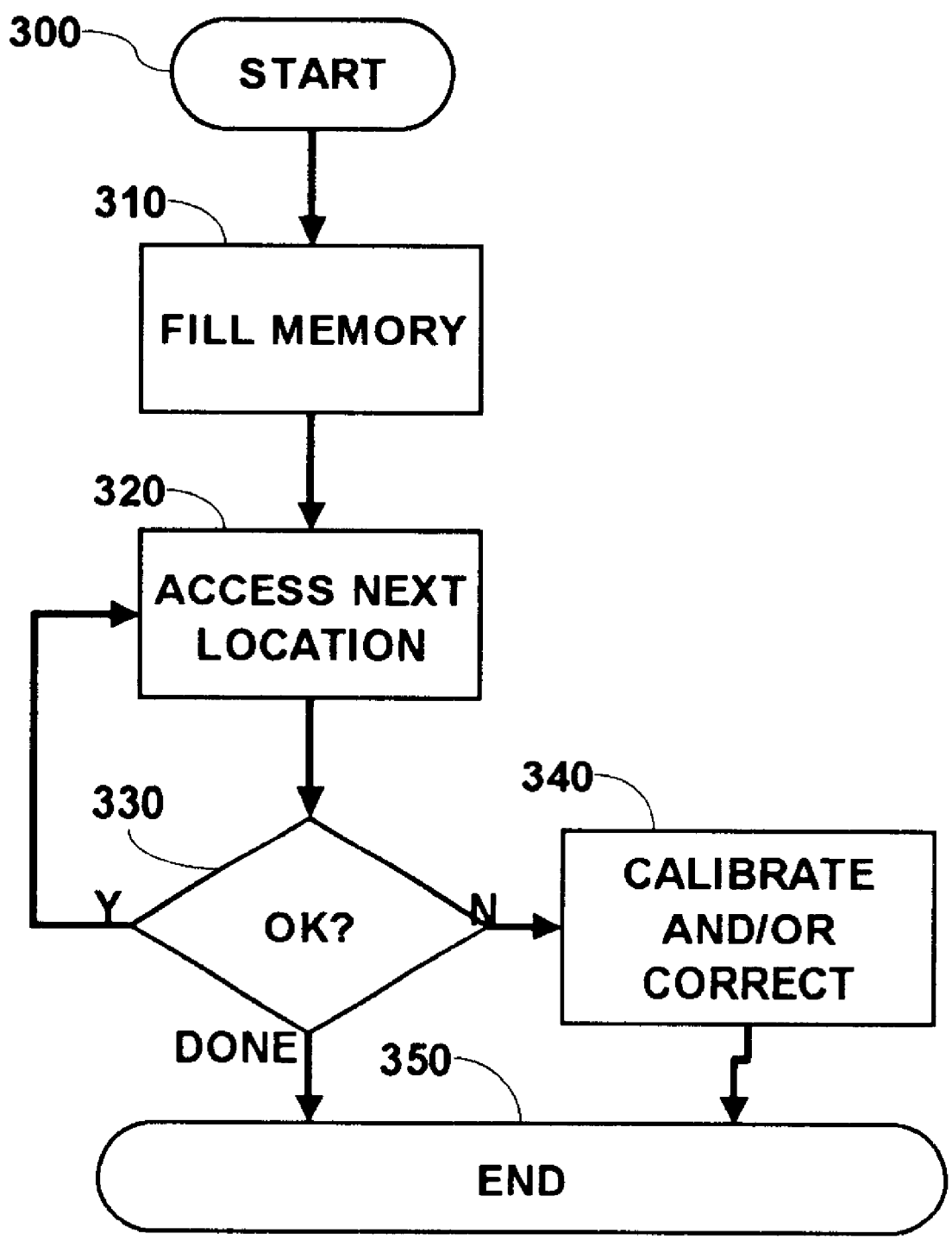
FIG. 4 is a flow diagram of a method of using a memory to test circuitry in a system by the memory test circuit illustrated in FIG. 3.

FIG. 4 is a flow diagram of a method of using a memory to test.circuitry in a system by the memory test circuit illustrated in FIG. 3. In FIG. 4, the testing begins in block 300. In block 310, a repeating pattern of data is written into all locations in the memory device 10: a first data word into a first location, a different second data word into a second location, and so forth until an entire pattern is written. That pattern is then repeated for successive locations in the memory device 10 until the entire memory device 10 is filled. The front end circuit 30 (of FIG. 3), or some portion of it, generates the repeating pattern data, and the memory controller 20 writes this data into successive locations of the memory device, all under control of the controller 40. In the illustrated embodiment, the pattern repeats after 31 or fewer data words.

There are several ways for the front end circuit 30 to produce this repeating pattern of data. First, the probe 5 may be connected to an external pattern generator (not shown), which is conditioned to produce signals which, if the front end circuit 30 is operating properly, will result in a repeating pattern of data values being written into the memory device 10. Second, the pattern generator 32 within the front end circuit 30 may be activated to insert a signal into the processing chain which, if the remainder of the processing chain in the front end circuit 30 is operating properly, will result in a repeating pattern of data values being written into the memory device 10. The pattern generator 32 may be fabricated on an application specific integrated circuit (ASIC) or on a portion of an ASIC containing additional circuitry. Such a pattern generator 32 may be connected to, or replicated at, various locations in the processing chain between the probe 5 and the memory device 10. One skilled in the art will understand that other methods of writing data into the memory device 10 may be utilized, provided the data written into the memory device 10 as a repeating pattern of, in the illustrated embodiment, up to 31 respective data words.

The pattern memory 50 is a small fast memory device, at least the same speed as the memory device 10, which contains locations for holding a data pattern. The data words in the pattern expected to have been written into the memory device 10 are written into successive locations in the pattern memory 50 by the microprocessor (not shown). In step 320, the pattern of data words previously written into the pattern memory 50 are read out one at a time in order and supplied to the corresponding input terminal of the comparator 60. Simultaneously, the memory control circuit 20 is conditioned to read successive data words from the memory device 10. The comparator 60 compares the first pattern data word from the pattern memory 50 to the retrieved data word from the first location in the memory device 10. A comparison signal representing the results of this comparison is supplied to the controller 40.

In step 330, if the comparison signal indicates that the data words are the same (Y), step 320 is repeated. In step 320 as repeated, the memory control circuit 20 retrieves the data word from the next memory location in the memory device 10 and the pattern memory 50 produces the next data word in the pattern, or the first data word in the pattern if the preceding one was the last data word in the pattern. These two data words are then compared, and the operation continues in step 330. If it is determined in step 330 that all the memory locations have been successfully tested (DONE), then the testing is complete and the DONE signal is asserted. The microprocessor (not shown) responds to the DONE signal by executing another test, and/or informing the user.

If, however, the comparison signal from the comparator 60 indicates that the pattern data word from the pattern memory 50 is different from the retrieved data word from the memory device 10 (N), step 340 is entered. In step 340, the controller 40 halts the memory test, and an error is indicated. As described above, this may be done by asserting a separate error signal or by asserting the DONE signal. In this case, the microprocessor accesses the memory address register in the memory controller 20 to determine if the test was completed successfully, or if not what address contained erroneous data. If an error is indicated, then diagnostic routines may be executed to determine the cause of the error.

Because the front end circuit 30 generates a pattern of memory words repeating after a limited number of words, the pattern memory 50 need have only a limited number of locations. More specifically, the pattern memory 50 does not need to have as many locations as there are in the memory device 10. Furthermore, the locations in the pattern memory 50 need contain only the pattern of expected values from the memory device 10. There is no need for each location in the pattern memory 50 to also include an address and data to be written into the memory device 10.

A test as illustrated in FIG. 4 may be performed as a part of general diagnostic testing of the instrument: i.e. to determine whether it is operating properly, and if not where the malfunctioning circuit is located, as described above. For example, the pattern generator 32 may be connected to various locations in the processing chain between the input probe 5 and the memory device 10. Initially, the pattern generator 32 may inject its signal into the processing chain near the memory device 10 and the memory contents tested as described above. If the test is successful, the pattern generator 32 injects its signal further upstream in the processing stream and the test is repeated. This continues until the pattern generator 32 is connected to a location resulting in a test failure. In this way, an inoperative portion of the signal processing chain may be located.

In addition, such a test may be.performed during manufacturing as a part of the calibration process. For example, the variable circuit element 34 in the front end circuitry 30 may be adjusted by generating signals, from either an external pattern generator coupled to the input probe 5 or the internal pattern generator 32, which, if the variable circuit element 34 is adjusted properly, will generate a repeated pattern in the memory device 10. The memory device 10 is tested as described above to determine if the expected pattern was stored in the memory device 10. If not, then in step 340, the setting of the variable circuit element 34 may be adjusted. The test is then repeated until the variable circuit element 34 is properly adjusted.

Also, such a test may be used to characterize the operational characteristics of the instrument. For example, the timing of the hardware circuits may be tested using the same technique. More specifically, the clock signals used in the front end circuit 30 (and other circuitry in the instrument) may be controlled to advance in phase to test the setup and hold time characteristics of the circuits. The contents of the memory device 10 is then tested, as described above, using an external pattern generator, to determine if the instrument circuitry is still operating properly. The clock signal may be advanced until the testing indicates a failure. This gives an indication of the operating margin for setup and hold times.

In a similar manner, the maximum data rate of the instrument may be determined. As in the setup and hold testing, described above, the clock frequency in the instrument is increased in increments, and the test described above executed. So long as the memory device 10 has the expected pattern, the instrument is operating properly. The clock frequency is then increased and the testing repeated. This continues until the testing indicates a failure. This gives an indication of the maximum data rate.

Figure 5:
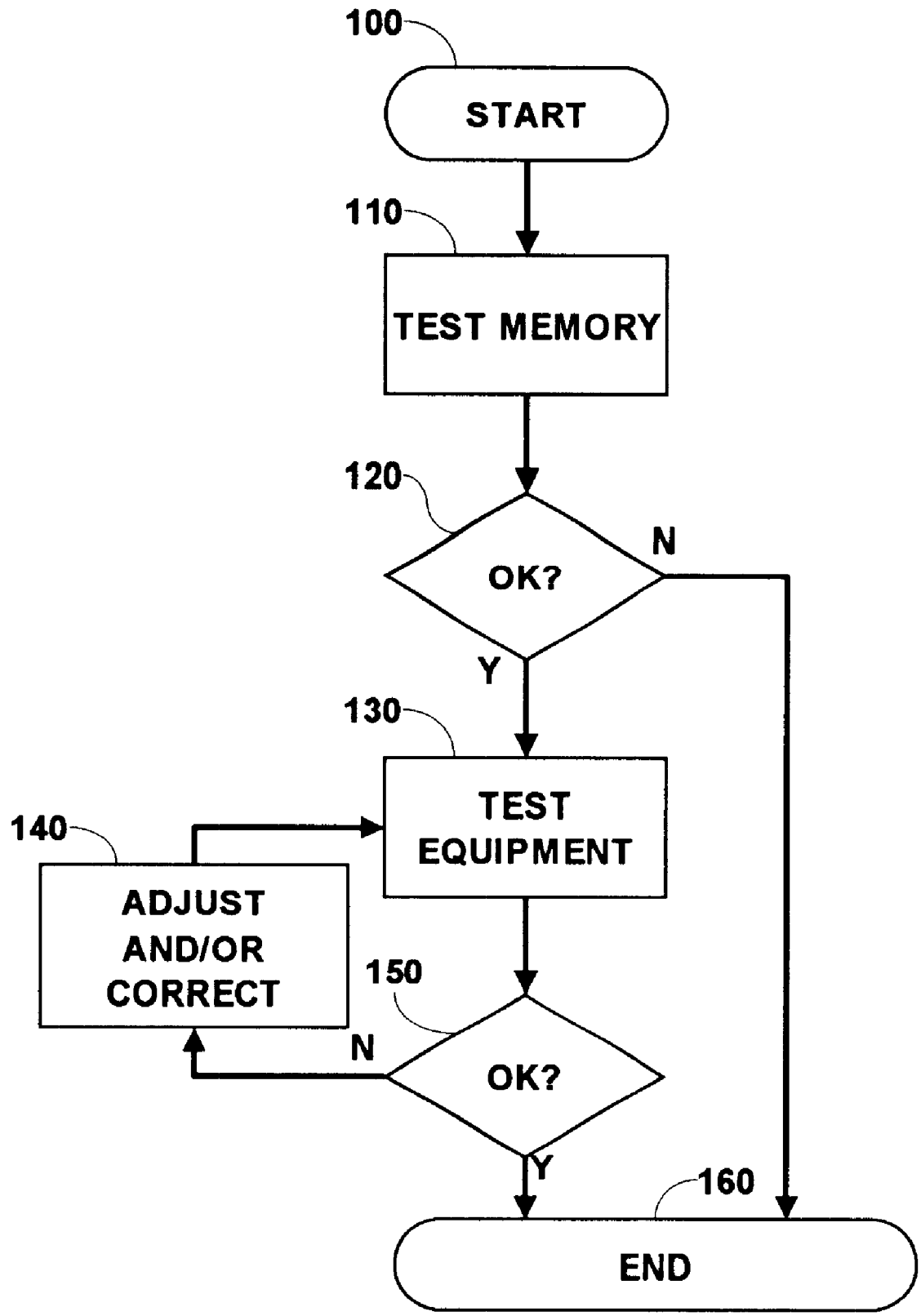
FIG. 5 is a flow diagram illustrating the overall testing process for an instrument using the memory test circuitry according to the present invention.

FIG. 5 is a flow diagram illustrating the overall testing process for an instrument using the memory test circuitry according to the present invention. In FIG. 5, testing begins in block 100. In block 100, the memory device 10 (of FIG. 1) is tested by itself as illustrated in FIG. 2. In block 120, if the results of that testing indicate that the memory device 10 is operating properly, then the memory device may be used to test the remainder of the instrument in block 130. Otherwise, the testing ends in block 160 and diagnostic testing may be performed on the memory device 10 to determine where the error occurs. In block 130 the remainder of the instrument is calibrated, and its operations and operational characteristics tested using the memory device 10 and associated testing circuit illustrated in FIG. 3. The tests are performed according to the process illustrated in FIG. 4 and described in detail above. If the tests indicate proper operation then the testing ends in block 160, otherwise adjustments are made (in the case of calibration tests), further diagnostics are performed (in the case of diagnostic testing to isolate the location of malfunctioning circuitry) or operational characteristics determined in block 140.

In all of these cases, the memory is located in situ within the instrument. Furthermore, the memory is filled at the full operational speed of the instrument, corresponding to the maximum speed of the memory device 10, and the contents of the memory are also tested at the same high speed. This reduces the amount of time necessary to perform the calibration, and manufacturing characterization and diagnostic tests. Such testing also reduces the power-on testing of the instrument to a reasonable amount of time. One skilled in the art will appreciate that the testing circuit and technique described above may be used in other ways to test operating characteristics of the instrument.

What is claimed is:

1. An electronic system, comprising:
   a source of test data, which, if the test data source is operating properly, is a pattern of a limited number of data words successively repeated;
   a memory device for storing the test data; and
   a memory test circuit having a memory controller coupled to the source of test data and the memory device for controlling access to the memory device, a pattern memory containing the pattern of data words, a controller coupled to the pattern memory and the memory controller for conditioning the memory controller to write test data from the test data source into the memory device and read test data from the memory device and conditioning the pattern memory to read data words from the pattern memory, and a comparator coupled to the memory controller and the pattern memory for comparing the stored test data to successively repeated pattern data words and generating a signal to indicate whether the stored test data is the same as the successively repeated pattern data words; wherein:
   the controller conditions the pattern memory to repeatedly access successive data words in the pattern of data words and simultaneously conditions the memory controller to read successive locations from the memory device, and responds to the compare signal.

2. The system of claim 1 wherein the source of test data further comprising: a write register, coupled to the memory device, for containing a value to write into a location in the memory device; and
   the pattern memory further comprises a read register, coupled to the comparator, for containing a value to compare to a value read from a location in the memory device.

3. The system of claim 1 wherein the test data source comprises a front end circuit having an output terminal coupled to the memory device.

4. The system of claim 3 where the front end circuit further comprises an input terminal coupleable to external circuitry.

5. The system of claim 4 wherein the front end circuit further comprises a processing circuit chain coupled between the input terminal and the output terminal.

6. The system of claim 3 wherein the processing circuit chain comprises a pattern generator having an output terminal coupleable to the processing chain.

7. The system of claim 3 wherein the processing circuit chain comprises a variable circuit element.

8. A method of operating an electronic system including a memory device, comprising the steps of:
   generating test data, which, if the system is operating properly, is a pattern of a limited number of data words successively repeated;
   storing the test data source in the memory device by writing a write value into every location in the memory device;
   setting the first location in the memory as the current memory location, setting an expected value to the write value, and setting a new write value;
   reading a read value from the current location in the memory device;
   comparing the read value to the expected value;
   if the read value is the expected value, writing the write value into the current location in the memory location, setting a next successive location in the memory as the current location, and repeating the reading and comparing steps otherwise halting the test;
   repeating the setting, reading, and comparing steps for each of the limited number of data words of the test data.

* * * * *